Figure 1A:
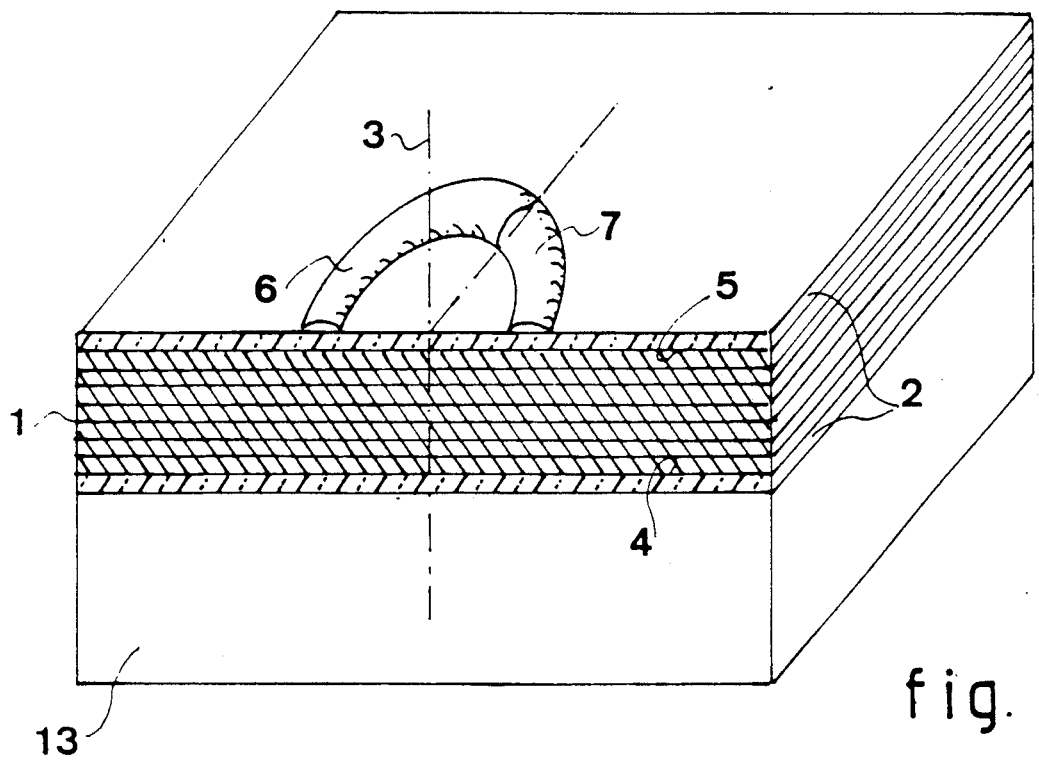

United States Patent [19]

Weisbuch et al.

[11] Patent Number: 5,055,422

[45] Date of Patent: Oct. 8, 1991

[54] PROCESS FOR THE CONSTRUCTION OF SEMICONDUCTOR LASERS AND LASERS OBTAINED BY THE PROCESS

[75] Inventors: Claude Weisbuch, Paris; Baudouin De Cremoux, Orsay; Jean P. Pocholle, Arpajon La Norville, all of France

[73] Assignee: Thomson-CSF, Puteaux, France

[21] Appl. No.: 543,787

[22] PCT Filed: Dec. 5, 1989

[86] PCT No.: PCT/FR89/00062

§ 371 Date: Jul. 24, 1990

§ 102(e) Date: Jul. 24, 1990

[87] PCT Pub. No.: WO90/06608

PCT Pub. Date: Jun. 14, 1990

[30] Foreign Application Priority Data

Dec. 9, 1988 [FR] France .................. 88 16215

[51] Int. Cl.⁵ .................. H01L 21/20; H01L 21/225
[52] U.S. Cl. .................. 437/129; 148/DIG. 95;
357/20; 372/46; 437/133; 437/152; 437/905;
437/987
[58] Field of Search .................. 148/DIG. 23, 35, 39,
148/37, 56, 65, 72, 84, 95, 119, 151, 33.1, 33.2,
33.5; 357/16, 17, 20; 372/43-46, 96, 47;
437/108, 110, 126, 127, 129, 133, 149, 152, 160,
936, 958, 987, 904, 905

[56] References Cited

U.S. PATENT DOCUMENTS

| | | | |
|---|---|---|---|
| 3,526,851 | 9/1970 | Pankove | 372/46 |
| 3,605,037 | 9/1971 | D'Asaro | 372/46 |
| 4,002,997 | 1/1977 | Thompson | 372/46 |
| 4,536,469 | 11/1981 | Adlerstein | 437/129 |
| 4,660,207 | 4/1987 | Svilans | 372/45 |
| 4,675,876 | 6/1987 | Svilans | 372/96 |
| 4,706,101 | 11/1987 | Nakamura et al. | 357/17 |
| 4,897,846 | 1/1990 | Yoshida et al. | 372/46 |
| 4,949,351 | 8/1990 | Imanaka | 372/45 |
| 4,990,972 | 2/1991 | Satoh et al. | 357/17 |

FOREIGN PATENT DOCUMENTS

| | | | |
|---|---|---|---|
| 0192088 | 11/1982 | Japan | 437/127 |
| 0168285 | 7/1986 | Japan | 437/129 |
| 0174686 | 8/1986 | Japan | 372/46 |
| 0276389 | 12/1986 | Japan | 372/46 |
| 0128481 | 5/1990 | Japan | 437/129 |
| 2203894 | 10/1988 | United Kingdom . | |

OTHER PUBLICATIONS

Soviet Journal of Quantum Electron, vol. 6 16, No. 7, Jul. 1986, Am. Inst. of Phys., New York, U.S., pp. 902–905; P. G. Eliseey et al.: "Light–Emission and Degradation Characteristics of InGaAsP/InP Heterostructures", p. 902.

Primary Examiner—Olik Chaudhuri
Assistant Examiner—William Bunch
Attorney, Agent, or Firm—Oblon, Spivak, McClelland, Maier & Neustadt

[57] ABSTRACT

The present invention relates to processes for the construction of semiconductor lasers.

The process according to the invention is essentially characterized in that it consists in forming a layer 1 of a laser semiconductor active medium, in forming an optical cavity 2 associated with this layer, in disposing, on at least a part of the surface of the layer, first 6 and second 7 layers of materials of impurities of opposite polarities, in causing diffusion into the active medium of at least a part of the two materials of impurities to form, in the first layer, a cylinder 8 axis substantially parallel to the axis of the optical cavity and formed of two semi-cylindrical half-shells 9, 10 of diffused impurities of opposite polarities, and in connecting two conductors 12 of the electrical energy respectively to the two half-shells.

Application to the construction of a plurality of laser diodes on one and the same support substrate, to create a homogeneous and dense single laser beam.

13 Claims, 2 Drawing Sheets

PROCESS FOR THE CONSTRUCTION OF SEMICONDUCTOR LASERS AND LASERS OBTAINED BY THE PROCESS

The present invention relates to processes for the construction of semiconductor lasers and lasers constructed in this manner.

A semiconductor laser is essentially composed of a crystalline-type active medium based, for example, on gallium arsenide, to which medium an electrical energy referred to as the "pumping electrical energy" is applied by means of two electrodes situated respectively on either side of the crystalline material.

Moreover, in order to obtain the stimulation of the optical radiation energy, the active medium is placed, as for all lasers, in a resonant optical cavity formed from two reflecting mirrors, at least one of which is partially transparent in order to permit the light energy stimulated inside the optical cavity to emerge from this cavity.

In the field of semiconductor lasers, the mirrors of the optical cavity are formed, for example, of multidielectric layers placed directly on the crystalline active material. This process for the construction of the elements of a resonant optical cavity is, moreover, conventional and well-known. However, there are other processes in existence, for example the stacking of semiconductor layers integrated into the actual structure of the crystal or of the substrate which supports the crystal.

The current techniques permit fairly well the respecting of all these features but there are still a certain number of problems, especially to arrange on the active medium the electrodes for supplying the pumping electrical energy. This problem arises more particularly in the case where a plurality of active media are implanted on a single base substrate, alongside one another essentially for the purpose of obtaining a plurality of light beams having substantially parallel directions of emission, all the more so as, in order to obtain a composite beam equivalent to a relatively dense and homogeneous single beam, it is essential that the active media should be disposed side by side, as close as possible and in such a manner that the axes of the resonant cavities are all oriented substantially perpendicularly to the surface through which the beam must be emitted.

The problem posed is then the construction of the electrodes for the supply of the electrical energy, being aware that these electrodes can be disposed only on the face with which at least one of the two mirrors of the optical cavity is flush.

A construction of semiconductor lasers is already known, in which the supply of the electrical energy is undertaken substantially in the plane of one of the mirrors of the optical cavity of the laser. This construction is obtained in the following manner. A start is made by depositing, on a support substrate, a first set of layers constituting a first mirror of the optical cavity. On this first set of layers there is deposited by epitaxy a second set of crystalline layers, for example of gallium arsenide, over a thickness equal to that which is necessary to obtain the desired laser active medium, and then a third set of layers, for example multidielectric, constituting the second mirror of the optical cavity, the lateral dimensions, length and width, of these three sets of layers being greater than those of the semiconductor laser to be obtained finally.

When this multilayer stack has been completed, a circular channel known by persons skilled in the art under the name of "mesa" is hollowed out, by removing a part of the two or three sets of layers to form, to some extent, a column.

In the channel there are then disposed, by any means, two types of differing materials, by laterally surrounding the column and in contact at least with the second set of layers; this forms the two electrodes. These two materials are, for example, semiconductor materials of P type and of N type respectively, such as gallium and aluminium arsenide doped respectively with zinc and silicon. The two materials fill the channel flush with the upper level of the third set of layers and, on their face flush with this level, there are respectively fixed two conductors of the electrical energy forming a resistive contact, for example based on gold, zinc, nickel or germanium.

This technique gives good results as regards the formation of a laser element on a substrate. Nevertheless, it exhibits certain disadvantages, essentially on cost grounds, on account of the large number of operations which it requires, and with regard to the space requirement, since it is difficult to construct channels of very small dimensions which are capable of receiving the materials which are to constitute the electrodes for the supply of the electrical energy. Thus, there is the limitation of being able to implant on a substrate of given dimensions only a relatively small number of laser elements; this is awkward for the purpose of obtaining a broad laser beam, which is both dense and homogeneous.

The object of the present invention is to alleviate the disadvantages mentioned hereinabove and to implement a process for the construction of semiconductor lasers which permits a reduction in their prime cost, and which permits the integration, on a substrate of given dimensions, of a number of laser optical cavities in a density which is higher than that permitted by the techniques known up to the present time.

More specifically, the subject of the present invention is a process for the construction of semiconductor lasers, which is characterized in that it consists:

in forming a layer of a semiconductor laser active medium having transverse dimensions greater than those of the active medium of the laser to be obtained, in forming a resonant optical cavity associated with the said layer, the said cavity being formed in such a manner that its optical axis is substantially perpendicular to the plane in which the said transverse dimensions are defined, in disposing, on at least a part of the surface of the said layer, first and second zones of materials of impurities of opposite polarities, in causing diffusion into a part of the said active medium, of at least a part of the two said materials of impurities, to form in the said layer substantially a cylinder of axis substantially parallel to the said axis of the said optical cavity and formed of two substantially semi-cylindrical half-shells respectively of diffused impurities of opposite polarities, and in connecting two conductors of the electrical energy respectively to the two half-shells.

The subject of the present invention is also a semiconductor laser obtained by the process according to the invention, this laser being characterized in that it comprises a resonant optical cavity, a laser active medium associated with the said optical cavity, the said active medium comprising two half-shells of diffused impurities of opposite polarities on, respectively, at least two portions of its lateral surface, and two conductors for the supply of the electrical energy respectively connected to the two said half-shells.

Figure 1B:
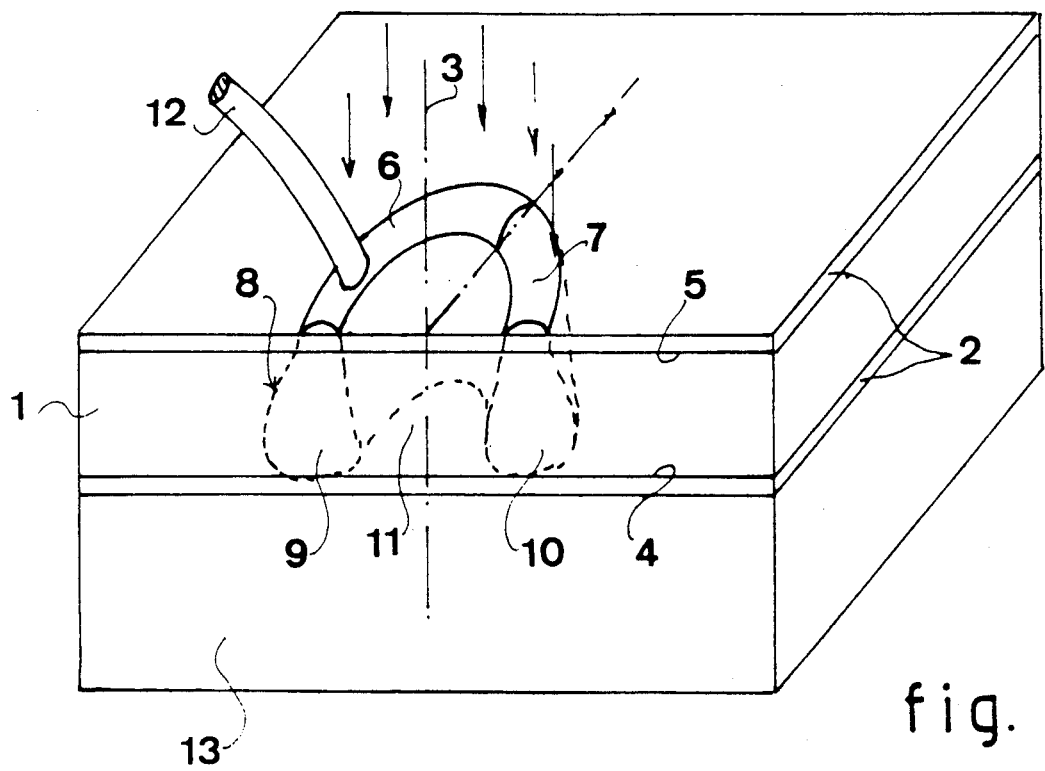
Figure 2:
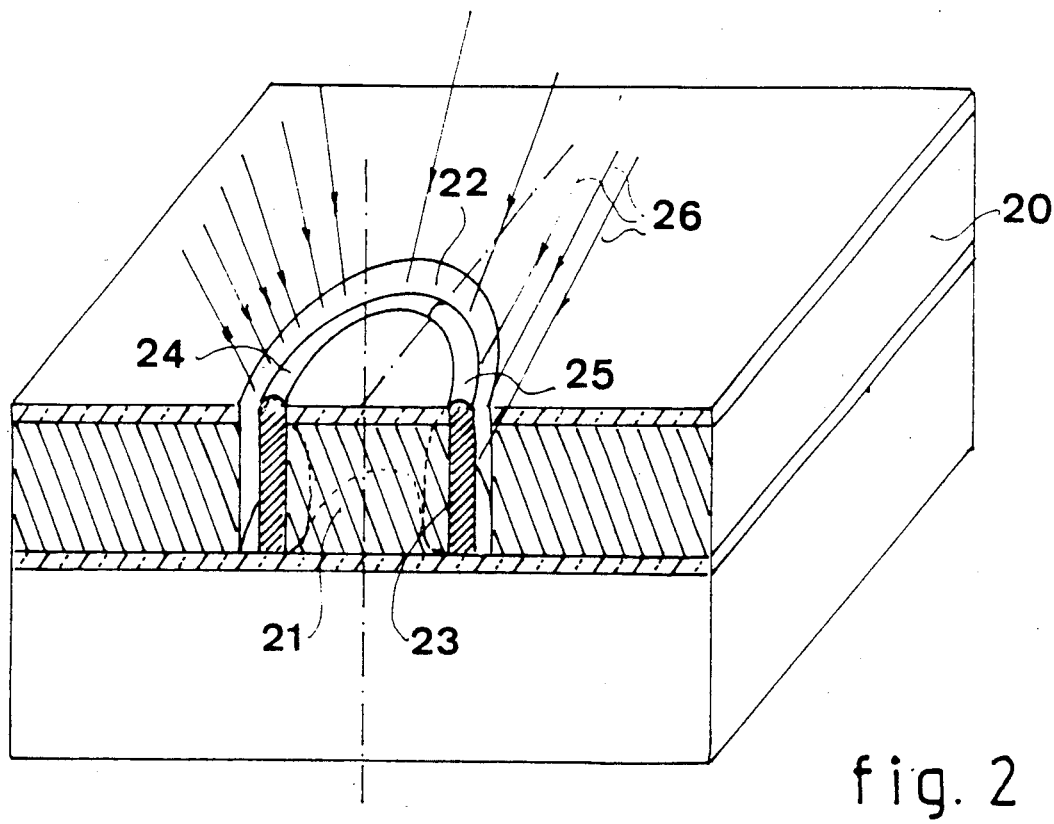
Figure 3:
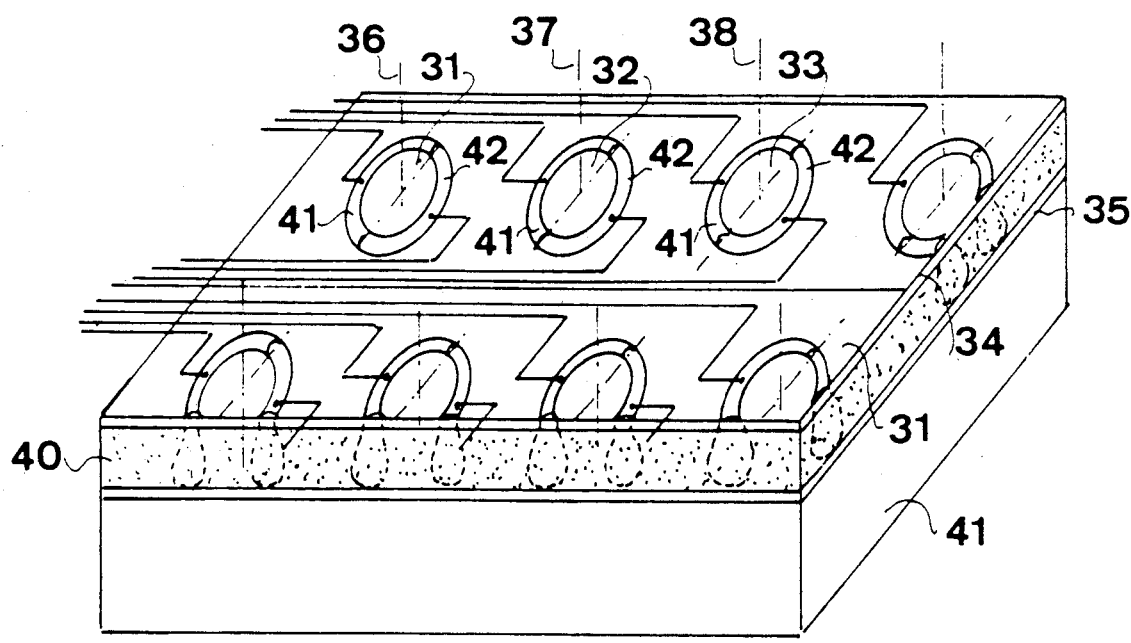

Other features and advantages of the present invention will emerge in the course of the following description which is given with reference to the accompanying drawings on an illustrative but in no sense limiting basis, in which drawings:

FIGS. 1A and 1B represent, respectively seen in cross-section and in perspective, a structural diagram of a semiconductor laser according to the invention, permitting an explanation of a first embodiment of the process according to the invention, FIG. 2 represents, seen in cross-section and in perspective, a structural diagram of a semiconductor laser permitting an explanation of a second embodiment of the process according to the invention, and FIG. 3 represents, by way of application, a set of semiconductor lasers integrated on one and the same support substrate permitting the production of a light beam which is of a large diameter and relatively dense and homogeneous.

The process for the construction of semiconductor lasers according to the invention consists, in a first step illustrated in FIG. 1A, in forming a layer 1 of a semiconductor laser active medium, advantageously on a support substrate 13, of transverse dimensions greater than those of the laser active medium when the laser is completed. By way of example, this active medium is composed of a stack of thin layers of gallium arsenide and of gallium aluminium arsenide.

With this active medium there is associated a resonant optical cavity 2 having a direction of optical axis 3 substantially perpendicular to the plane in which the transverse dimensions of the layer 1 are defined. This cavity is formed of two mirrors obtained, for example, by the deposit of a layer of a dielectric material on each one of the two opposite faces 4, 5 of the layer of active medium which are respectively contained in two planes parallel to that in which the transverse dimensions are defined.

In a possible embodiment of the invention, the first step defined hereinabove may be implemented in the following manner:

There are performed, in a suitable reactor, sequential deposits of epitaxial layers, in the following order, taking as reference the upper face of the base substrate 13 which serves as support: formation of a first mirror referred to as the "lower" mirror, deposit of the active medium on this first mirror, and deposit of the second mirror referred to as the "upper" mirror which, being associated with the first, forms the resonant optical cavity. Just like the mirrors, the active medium may be composed of a set of thin layers of semiconductors. The preferred materials are of the GaAlAs/GaAs group or of the GaInAsP/InP group.

The mirrors are obtained, for example, by stacking of semiconductor layers of alternate indices or of different indices.

In a second step of the process, for example by implantation or deposit, there are disposed directly on at least a part of the surface of the layer 1 of active medium, or indirectly on the upper mirror of the optical cavity 2, first 6 and second 7 zones of materials including impurities of opposite polarities, for example the P-type and N-type impurities constituted by zinc and silicon. In the illustrated example, these two zones of impurities 6, 7 are implanted indirectly on the face 5 perpendicular to the optical axis 3 opposite the face 4 in contact with the support substrate 13, through the upper mirror of the optical cavity.

The following step of the process, in the present case the third, consists in causing the diffusion into the laser active medium of the materials of the two zones of impurities 6, 7, to form in the first layer 1, as illustrated in FIG. 1B, substantially a cylinder 8 of axis parallel to the optical axis 3 of the resonant optical cavity 2. This cylinder 8 is composed of two half-shells 9, 10 of diffused impurities of opposite polarities and delimiting a column 11 of the semiconductor laser active medium. The diffusion of the materials of impurities into the layer 1 is performed in such a manner that the height of the cylinder 8 is substantially equal to the thickness of the layer of active medium included between its two external faces 4, 5 perpendicular to the optical axis 3. By way of example, the diffusion is obtained by heat treatment, for example by subjecting the assembly to a temperature of the order of 450 degrees C. for approximately 30 minutes.

On resuming the advantageous illustrative embodiment given hereinabove, the depth of the diffusion of the atoms of impurities into the epitaxial structure is within the range of between one and ten microns.

When the diffusion into the layer 1 is completed, in a final step, two conductors for the supply of the electrical energy are respectively connected to the two half-shells 9, 10, only one, 12, having been shown in FIG. 1B.

In the example given hereinabove with reference to FIGS. 1A and 1B, the two zones of materials of impurities of opposite polarities are disposed on a face of the layer of active medium perpendicular to the optical axis of the resonant cavity. However, for certain applications, in particular when the transverse dimensions of this layer are relatively large, it is possible, as represented in FIG. 2, to delimit, in the layer of active medium 20, a column 21, by hollowing out therein a circular channel 22.

The following step of the process then consists in disposing on two portions of the cylindrical peripheral surface 23 of the column 21 respectively two zones of impurities of opposite polarities 24, 25. This second embodiment of the process permits the production of heights of resonant cavities greater than those obtained with the first embodiment described hereinbefore. Furthermore, it is advantageous for the purpose of obtaining semiconductor lasers having large transverse dimensions.

In fact, in the course of the first embodiment of the process, the thickness of the half-shells broadens in progressing away from the level of the first and second zones of impurities; this may give rise to a problematic increasing lateral space requirement.

On the other hand, in the case of the construction of semiconductor lasers having an optical cavity of large dimensions, with the second embodiment of the process, the lateral broadening of the half-shells which has been described hereinabove is avoided, since it is then possible to effect a diffusion of the impurities into the active medium.

It is stated that the impurities are "P"-type or "N"-type dopant atoms, for example atoms of zinc or of silicon respectively, and have concentrations which are in all cases less than $10^{-3}$, while the constitutive elements of the semiconductors are gallium (Ga), aluminium (Al) and arsenic (As) for the materials of the GaAlAs/GaAs group, and gallium, indium (In), arsenic and phosphorus (P) for those of the GaAsInP/InP group. The concentration of these constitutive elements may adopt any value within the range between 0 and 0.5, subject to the condition that there are as many atoms of column III of the classification of the elements (Ga, Al, In,) as of column V (As, P).

At the same time as the diffusion of the impurities there takes place, under the conditions mentioned hereinbelow, the interdiffusion of the principal constitutive elements of the epitaxial layers. What is involved, more specifically, in this case is the process of interdiffusion assisted by the diffusion of the impurities, in the course of which the constitutive elements of the layers are mixed when the impurities are diffused therein. If the starting point is a regular stack of fine layers ($\lesssim 100$ Å) of differing compositions (for example: GaAs/AlAs/-GaAs/AlAs/...), it is possible to obtain, after diffusion, a mixture of mean formula $Ga_{0.5}Al_{0.5}As$. Proceeding from an ordered material or superalloy, a solid solution or disordered alloy is obtained.

The benefit of this process which is utilized for the construction of the half-shells as represented in FIGS. 1B and 2 is that, as regards the lasers according to the invention, the disordered alloy has advantageous properties as compared with those of the superalloy. However, it should be noted that, in order to obtain the effect of interdiffusion, the range of which is limited, it is necessary that the thickness of each one of the thin layers which constitute the active region should be small, typically less than 100 Å, while this does not apply for the mirrors of the optical cavity.

This diffusion and interdiffusion are, for example, obtained by heating by means of an electromagnetic radiation 26, such as that given by a laser or the like, it being possible for a radiation of this type to penetrate the channel 22 easily along a direction which is oblique in relation to the cylindrical lateral surface 23.

Nevertheless, the broadening of the thickness of the half-shells in the course of the diffusion according the first embodiment of the process may be limited by subjecting the layer of laser active medium to lateral stresses oriented towards the centre of the active medium, that is to say substantially towards the optical axis of the resonant cavity and in such a manner that the resultant of the pressure forces is substantially zero or parallel to this optical axis.

To avoid a great broadening of the thickness of the two half-shells, it may also be advantageous to form the laser active medium in superposed successive partial layers. In this case, the implantation of the first and second zones of impurities is advantageously obtained by the localized successive implantation of impurities supplied by ion beams focused on each partial layer after it has been formed.

FIG. 3 represents, by way of advantageous application of the implementation of the process, a plurality of semiconductor lasers of the "laser diodes" type 31, 32, 33, ... juxtaposed side by side in such a manner that the mirrors of their resonant cavities are all substantially situated in two identical planes 34, 35 and that their optical axes 36, 37, 38, ... are parallel. In this case, the active medium 40 is formed on a substrate 41 which serves as support for the set of diodes. The laser diodes illustrated in FIG. 3 have been constructed according to the first embodiment of the process described hereinabove, that is to say from the implantation of two zones 41, 42 of impurities of opposite polarities on one of the two faces of the active medium which are perpendicular to the set of optical axes of the various cavities of the laser diodes, more particularly on the face opposite to that which is in proximity to or in contact with the support substrate.

Such an assembly of laser diodes juxtaposed side by side could, of course, also be obtained by the second embodiment of the process described with reference to FIG. 2.

It is apparent that the structure of a semiconductor laser obtained by the process according to the invention, two advantageous illustrative embodiments of which have been described hereinabove, comprises an active medium which is completely delimited laterally; this permits the obtaining of a current having a relatively low threshold for the initiation of the laser effect, this delimitation being completely obtained by the spatial control of the diffusion and of the interdiffusion, both in a vertical and in a transverse direction, that is to say parallel or perpendicular to the optical axis of the cavity. This configuration further permits the limitation of the transverse space requirement of each semiconductor laser, as developed hereinbefore, and thus the obtaining, on one and the same substrate, of a density of lasers, for example of the "diodes" type, which is greater than that which can be obtained with the processes according to the prior art.

What is claimed is:

1. Process for the construction of semiconductor lasers, characterized in that it consists:
    in forming a layer of a semiconductor laser active medium (1, 20, 40) having transverse dimensions greater than those of the active medium of the laser to be obtained,
    in forming a resonant optical cavity (2) associated with the said layer, the said cavity being formed in such a manner that its optical axis (3) is substantially perpendicular to the plane in which the said transverse dimensions are defined,
    in disposing, on at least a part (5, 23) of the surface of the said layer, first (6, 24, 41) and second (7, 25, 42) zones of materials of impurities of opposite polarities,
    in causing diffusion into a part of the said active medium, of at least a part of the two said materials of impurities, to form in the said layer substantially a cylinder (8) of axis substantially parallel to the said axis of the said optical cavity and formed of two substantially semi-cylindrical half-shells (9, 10-24, 25) respectively of diffused impurities of opposite polarities, and
    in connecting two conductors (12) of the electrical energy respectively to the two half-shells.

2. Process according to claim 1, characterized in that the said layer of active medium (1, 20, 40) is composed of a stack of thin layers selected from among the two following groups consisting of: GaAs/GaAlAs and GaInAsP/InP.

3. Process according to claim 2, characterized in that the thickness of the said thin layers is at most equal to 100 Å.

4. Process according to one of claims 1 to 3, characterized in that the said first (6, 24) and second (7, 25) zones contain P-type and N-type impurities respectively.

5. Process according to one of claims 1 to 3, characterized in that the said first and second zones contain zinc and silicon respectively.

6. Process according to one of claims 1 to 3, characterized in that the diffusion of the impurities is obtained by heat treatment.

7. Process according to claim 6, characterized in that the heat treatment is obtained by application of a beam (26) of electromagnetic radiation.

8. Process according to one of claims 1 to 3, characterized in that the said first and second zones (6, 7) are disposed on a face (5) of the said layer of active medium (1) perpendicular to the said axis (3) of the resonant optical cavity (2).

9. Process according to one of claims 1 to 3, characterized in that the said active medium is conformed substantially in the form of a column (21) delimited by a cylindrical lateral surface (23) and the axis of which is substantially parallel to the axis of the said resonant optical cavity, the said first and second zones (24, 25) being disposed on the said cylindrical lateral surface (23).

10. Process according to one of claims 1 to 3, characterized in that, in the course of the diffusion operation, the said active medium is subjected to stresses substantially oriented towards the axis of the said resonant optical cavity.

11. Process according to claim 1, characterized in that the said active medium is formed by a stack of successive partial layers, the said first and second zones being disposed by means of impurity ion beams focused on each partial layer after it has been formed.

12. Process according to one of claims 1 to 3, characterized in that the operation consisting in disposing, on at least a part of the surface of the said layer, first and second zones of materials of impurities of opposite polarities, is selected from among the following two operations, deposition and implantation.

13. Semiconductor laser obtained by the process according to at least one of claims 1 to 3, characterized in that it comprises a resonant optical cavity (2), a laser active medium (1, 20, 40) associated with the said optical cavity, the said active medium comprising two half-shells (9, 10) of impurities of opposite polarities diffused on, respectively, at least two portions of its lateral surface (5, 23), and two conductors (12) for the supply of the electrical energy which are respectively connected to the two said half-shells.

* * * * *

UNITED STATES PATENT AND TRADEMARK OFFICE
CERTIFICATE OF CORRECTION

PATENT NO. : 5,055,422
DATED : October 8, 1991
INVENTOR(S) : Claude Weisbuch et al.

It is certified that error appears in the above-identified patent and that said Letters Patent is hereby corrected as shown below:

On the title page:

The [86], PCT No. is incorrect, should be,--PCTFR89/00629--.

Signed and Sealed this

Sixteenth Day of March, 1993

Attest:

STEPHEN G. KUNIN

*Attesting Officer*   Acting Commissioner of Patents and Trademarks